United States Patent
Yang et al.

(10) Patent No.: US 10,168,376 B2
(45) Date of Patent: Jan. 1, 2019

(54) LEAKAGE CURRENT DETECTION CIRCUIT, HIGH VOLTAGE DIRECT CURRENT SYSTEM, AND DETECTION METHOD AND APPARATUS

(71) Applicant: Huawei Technologies Co., Ltd., Shenzhen (CN)

(72) Inventors: Jing Yang, Shenzhen (CN); Zongwang Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 177 days.

(21) Appl. No.: 15/339,117

(22) Filed: Oct. 31, 2016

(65) Prior Publication Data

US 2017/0045568 A1    Feb. 16, 2017

Related U.S. Application Data

(63) Continuation of application No. PCT/CN2015/075032, filed on Mar. 25, 2015.

(30) Foreign Application Priority Data

Apr. 29, 2014    (CN) .......................... 2014 1 0178867

(51) Int. Cl.
  *G01R 31/02*    (2006.01)
  *G01R 31/12*    (2006.01)
  (Continued)

(52) U.S. Cl.
  CPC .......... *G01R 31/025* (2013.01); *G01R 19/10* (2013.01); *G01R 31/02* (2013.01); *G01R 31/1272* (2013.01); *G01R 19/0092* (2013.01)

(58) Field of Classification Search
  CPC ................ G01R 19/00; G01R 19/0084; G01R 19/0092; G01R 19/10; G01R 19/16571;
  (Continued)

(56) References Cited

U.S. PATENT DOCUMENTS 6,763,107 B1 *  7/2004  Fischer ............... H04M 19/001
                                              379/399.01
6,845,156 B1 *  1/2005  Laturell ................ H04M 19/08
                                              379/399.01
(Continued)

FOREIGN PATENT DOCUMENTS

CN        102830283 A        12/2012
CN        103091596 A        5/2013
(Continued)

OTHER PUBLICATIONS

Machine Translation and Abstract of Chinese Publication No. CN103941141, dated Jul. 23, 2014, 4 pages.
(Continued)

*Primary Examiner* — Hoai-An D. Nguyen
(74) *Attorney, Agent, or Firm* — Conley Rose, P.C.

(57) ABSTRACT

A leakage current detection circuit includes a first resistor located on a positive direct current bus, a second resistor located on a negative direct current bus, and a detection processing circuit separately connected to the first resistor and the second resistor, where the first resistor and the second resistor are located on a trunk circuit in a system including the positive direct current bus, the negative direct current bus, and a load, and the detection processing circuit is configured to detect a current flowing through the first resistor, detect a current flowing through the second resistor, and determine a difference between the current flowing through the first resistor and the current flowing through the second resistor as a leakage current.

13 Claims, 5 Drawing Sheets

(51) Int. Cl.
*G01R 19/10* (2006.01)
*G01R 19/00* (2006.01)

(58) Field of Classification Search
CPC ...... G01R 31/00; G01R 31/02; G01R 31/021;
G01R 31/024; G01R 31/025; G01R
31/12; G01R 31/1272; G01R 31/28;
G01R 27/00; G01R 27/26; G01R
27/2617; G01R 27/2688
USPC ....... 324/500, 509, 512, 522, 537, 541, 544,
324/551, 555, 557, 600, 649, 691, 713,
324/718; 702/1, 57, 64
See application file for complete search history.

(56) References Cited

U.S. PATENT DOCUMENTS

| | | | |
|---|---|---|---|
| 2002/0190734 A1* | 12/2002 | Burt | H03F 3/347 324/713 |
| 2008/0129308 A1 | 6/2008 | Lindsey et al. | |
| 2011/0273200 A1 | 11/2011 | Zha et al. | |
| 2012/0314327 A1 | 12/2012 | Liu et al. | |
| 2014/0191772 A1* | 7/2014 | Hetzler | G01R 1/203 324/705 |
| 2016/0077553 A1* | 3/2016 | Hyun | G06F 3/0412 345/690 |
| 2016/0309045 A1* | 10/2016 | Peker | H04L 12/10 |
| 2017/0236683 A1* | 8/2017 | Hegele | H01J 37/28 250/307 |

FOREIGN PATENT DOCUMENTS

| | | |
|---|---|---|
| CN | 103229060 A | 7/2013 |
| CN | 203324419 U | 12/2013 |
| CN | 103779833 A | 5/2014 |
| CN | 103941141 A | 7/2014 |
| JP | 2000002738 A | 1/2000 |
| WO | 20040051289 A1 | 6/2004 |

OTHER PUBLICATIONS

Machine Translation and Abstract of Chinese Publication No. CN103091596, dated May 8, 2013, 12 pages.
Machine Translation and Abstract of Chinese Publication No. CN103779833, Part 1, dated May 7, 2014, 5 pages.
Machine Translation and Abstract of Chinese Publication No. CN103779833, Part 2, dated May 7, 2014, 2 pages.
Machine Translation and Abstract of Chinese Publication No. CN203324419, dated Dec. 4, 2013, 12 pages.
Machine Translation and Abstract of Japanese Publication No. JP2000002738, dated Jan. 7, 2000, 10 pages.
Machine Translation and Abstract of European Publication No. WO2004051289, dated Jun. 17, 2004, 23 pages.
Foreign Communication From A Counterpart Application, European Application No. 15785269.0, Extended European Search Report dated Feb. 23, 2017, 7 pages.
Foreign Communication From A Counterpart Application, Chinese Application No. 201410178867.6, Chinese Office Action dated Feb. 1, 2016, 11 pages.
Foreign Communication From A Counterpart Application, PCT Application No. PCT/CN2015/075032, English Translation of International Search Report dated Jul. 22, 2015, 2 pages.
Foreign Communication From A Counterpart Application, PCT Application No. PCT/CN2015/075032, English Translation of Written Opinion dated Jul. 22, 2015, 7 pages.

* cited by examiner

LEAKAGE CURRENT DETECTION CIRCUIT, HIGH VOLTAGE DIRECT CURRENT SYSTEM, AND DETECTION METHOD AND APPARATUS

CROSS-REFERENCE TO RELATED APPLICATIONS

This application is a continuation of International Patent Application No. PCT/CN2015/075032 filed on Mar. 25, 2015, which claims priority to Chinese Patent Application No. 201410178867.6 filed on Apr. 29, 2014. The disclosures of the aforementioned applications are hereby incorporated by reference.

TECHNICAL FIELD

The present application relates to the field of power electronic technologies, and in particular, to a leakage current detection circuit, a high voltage direct current system, and a leakage current detection method and apparatus.

BACKGROUND

In a high voltage direct current system, insulation detection is a mandatory function, and leakage current detection is an essential part of the insulation detection. In some approaches, a common leakage current detection method is a sensor detection method. In the sensor detection method, the principle of electromagnetic induction is used, and detection is performed using a sensor (for example, a Hall effect sensor). In an embodiment, a sensor used to simultaneously detect currents flowing through positive and negative buses, and when insulation of the system is normal, because the currents have equal values but opposite directions, magnetic fields passing through the sensor are canceled by each other, and a detected leakage current is 0. When an insulation fault occurs in the system, regardless of a current leakage from the positive bus or a current leakage from the negative bus, values of the currents flowing through the sensor are not equal. Therefore, a magnetic field is not zero and a value of a current can be calculated by detecting a voltage signal output by the sensor. According to the sensor detection method, a difference between currents flowing through the positive and negative buses is detected, and a value of a leakage current is calculated by performing electromagnetic conversion for the sensor. This type of sensor has high manufacturing costs and low sensitivity, and cannot perform detection when a leakage current has a relatively small value. Moreover, the sensor is sensitive to a magnetic field, and a false alarm easily occurs when the sensor is used in an environment with high interference intensity.

A block diagram of the principle of present leakage current detection is shown in FIG. 1, and mainly includes a battery, a rectification module 11, a load 12, and a sensor 13. Positive and negative buses both pass though the sensor 13, to supply power to the load 12. Normally, when insulation of a system is normal, there is no current leakage, and a current I1 flowing through the positive bus and a current I4 flowing through the negative bus have equal values but opposite directions. Subsequently, magnetic fields in the sensor that are generated by I1 and I4 are canceled by each other, and output of the sensor 13 is 0. When an insulation fault occurs in the system (e.g., in the positive bus) with a current leakage, assuming that a leakage current is I2 (where $R_{in}$ is an equivalent ground resistor), a value of I1 is equal to a value of I2 plus a value of I3, thus, a magnetic field passing through the sensor 13 is not 0. Furthermore, a value of a leakage current can be calculated by detecting a voltage output by the sensor. In an existing leakage current detection technology, the electromagnetic principle is used, and a leakage current is detected using a sensor. However, since the sensor has a poor capability of detecting a small signal, sensitivity is low. Moreover, due to the sensor is sensitive to a magnetic field, a false alarm may easily occur when the sensor is used in an environment with high interference intensity, which further reducing system reliability.

Consequently, in the existing leakage current detection technology, a leakage current is detected using the electromagnetic principle, and a sensor for detecting a magnetic field has relatively low sensitivity. Therefore, it is very difficult for the sensor to detect the leakage current when a leakage current is relatively low, and a false alarm may be easily triggered when the sensor for detecting a magnetic field is applied to an environment with relatively strong magnetic field interference, thereby reducing system reliability.

SUMMARY

Embodiments of the present application provide a leakage current detection circuit, a high voltage direct current system, and a leakage current detection method and apparatus in order to resolve problems in an existing leakage current detection technology that when a leakage current is relatively low and a sensor for detecting a magnetic field has relatively low sensitivity, it is very difficult for the sensor to detect the leakage current, and a false alarm may easily occur when the sensor is applied to an environment with relatively strong magnetic field interference, thereby reducing system reliability.

According to a first aspect, a leakage current detection circuit is provided, including a first resistor located on a positive direct current bus, a second resistor located on a negative direct current bus, and a detection processing circuit separately connected to the first resistor and the second resistor, where the first resistor and the second resistor are located on a trunk circuit in a system including the positive direct current bus, the negative direct current bus, and a load, or are located on a same branch circuit in the system, and the detection processing circuit is configured to detect a current flowing through the first resistor, detect a current flowing through the second resistor, and determine a difference between the current flowing through the first resistor and the current flowing through the second resistor as a leakage current.

With reference to the first aspect, in a first possible implementation manner, the detection processing circuit is further configured to determine an insulation fault occurs in a circuit including the load and located between the first resistor and the second resistor in the system when the leakage current is not equal to 0, and determine insulation of the system is normal when the leakage current is equal to 0.

With reference to the first aspect, in a second possible implementation manner, the leakage current detection circuit provided in this embodiment of the present application further includes a third resistor located on the positive direct current bus and a fourth resistor located on the negative direct current bus, where the detection processing circuit is separately connected to the third resistor and the fourth resistor. The detection processing circuit is further configured to detect a current flowing through a third resistor, and detect a current flowing through a fourth resistor. When the first resistor and the second resistor are located on the trunk circuit in the system, and the third resistor and the fourth resistor are located on a same branch circuit in the system, the detection processing circuit is further configured to determine an insulation fault occurs in a circuit that includes the load located between the third resistor and the fourth resistor, and a leakage current is a difference between the current flowing through the third resistor and the current flowing through the fourth resistor when the current flowing through the third resistor is not equal to the current flowing through the fourth resistor, and determine, when the current flowing through the third resistor is equal to the current flowing through the fourth resistor and the current flowing through the first resistor is not equal to the current flowing through the second resistor, an insulation fault occurs in a positive direct current bus between the first resistor and the third resistor, or an insulation fault occurs in a negative direct current bus between the second resistor and the fourth resistor, or an insulation fault occurs in a circuit other than the circuit located between the third resistor and the fourth resistor, in a circuit including the load located between the first resistor and the second resistor in the system, and a leakage current is the difference between the current flowing through the first resistor and the current flowing through the second resistor, Alternatively, when the first resistor and the second resistor are located on a same branch circuit in the system, and the third resistor and the fourth resistor are located on the trunk circuit in the system, the detection processing circuit is further configured to determine an insulation fault occurs in a circuit that includes the load and that is located between the first resistor and the second resistor, and a leakage current which is the difference between the current flowing through the first resistor and the current flowing through the second resistor when the current flowing through the first resistor is not equal to the current flowing through the second resistor, and determine, when the current flowing through the first resistor is equal to the current flowing through the second resistor, and the current flowing through the third resistor is not equal to the current flowing through the fourth resistor, an insulation fault occurs in a positive direct current bus between the first resistor and the third resistor, or an insulation fault occurs in a negative direct current bus between the second resistor and the fourth resistor, or an insulation fault occurs in a circuit other than the circuit located between the first resistor and the second resistor, in a circuit including the load located between the third resistor and the fourth resistor in the system, and a leakage current is a difference between the current flowing through the third resistor and the current flowing through the fourth resistor.

With reference to the second possible implementation manner of the first aspect, in a third possible implementation manner, the detection processing circuit is further configured to determine that insulation of the system is normal when the current flowing through the first resistor is equal to the current flowing through the second resistor and the current flowing through the third resistor is equal to the current flowing through the fourth resistor.

According to a second aspect, a high voltage direct current system is provided, including a direct current power, a positive direct current bus, a negative direct current bus, a rectification module, a load, and the leakage current detection circuit provided in the embodiment of the present application.

According to a third aspect, a leakage current detection method is provided, including detecting a current flowing through a first resistor, and detecting a current flowing through a second resistor, and determining a difference between the current flowing through the first resistor and the current flowing through the second resistor as a leakage current, where the first resistor is located on a positive direct current bus, the second resistor is located on a negative direct current bus, and the first resistor and the second resistor are located on a trunk circuit in a system including the positive direct current bus, the negative direct current bus, and a load, or are located on a same branch circuit in the system.

With reference to the third aspect, in a first possible implementation manner, the method further includes determining that an insulation fault occurs in a circuit including the load and located between the first resistor and the second resistor in the system when the leakage current is not equal to 0, and determining that insulation of the system is normal when the leakage current is equal to 0.

With reference to the third aspect, in a second possible implementation manner, the method further includes detecting a current flowing through a third resistor, and detecting a current flowing through a fourth resistor, where the third resistor is located on the positive direct current bus and the fourth resistor is located on the negative direct current bus. When the first resistor and the second resistor are located on the trunk circuit in the system, the third resistor and the fourth resistor are located on a same branch circuit in the system, and the current flowing through the third resistor is not equal to the current flowing through the fourth resistor, determining that an insulation fault occurs in a circuit that includes the load and that is located between the third resistor and the fourth resistor, and a leakage current which is a difference between the current flowing through the third resistor and the current flowing through the fourth resistor. When the current flowing through the third resistor is equal to the current flowing through the fourth resistor, and the current flowing through the first resistor is not equal to the current flowing through the second resistor, determining that an insulation fault occurs in a positive direct current bus between the first resistor and the third resistor, or an insulation fault occurs in a negative direct current bus between the second resistor and the fourth resistor, or an insulation fault occurs in a circuit other than the circuit located between the third resistor and the fourth resistor, in a circuit including the load located between the first resistor and the second resistor in the system, and a leakage current which is the difference between the current flowing through the first resistor and the current flowing through the second resistor; or when the first resistor and the second resistor are located on a same branch circuit in the system, the third resistor and the fourth resistor are located on the trunk circuit in the system, and the current flowing through the first resistor is not equal to the current flowing through the second resistor, determining that an insulation fault occurs in a circuit that includes the load located between the first resistor and the second resistor, and a leakage current which is the difference between the current flowing through the first resistor and the current flowing through the second resistor. When the current flowing through the first resistor is equal to the current flowing through the second resistor, and the current flowing through the third resistor is not equal to the current flowing through the fourth resistor, determining that an insulation fault occurs in a positive direct current bus between the first resistor and the third resistor, or an insulation fault occurs in a negative direct current bus between the second resistor and the fourth resistor, or an insulation fault occurs in a circuit other than the circuit located between the first resistor and the second resistor, in a circuit including the load located between the third resistor and the fourth resistor in the system, and a leakage current which is a difference between the current flowing through the third resistor and the current flowing through the fourth resistor.

With reference to the second possible implementation manner of the third aspect, in a third possible implementation manner, the method further includes determining that insulation of the system is normal when the current flowing through the first resistor is equal to the current flowing through the second resistor and the current flowing through the third resistor is equal to the current flowing through the fourth resistor.

According to a fourth aspect, a leakage current detection apparatus is provided, including a detection module configured to detect a current flowing through a first resistor, and detect a current flowing through a second resistor, and a determining module configured to determine a difference between the current flowing through the first resistor and the current flowing through the second resistor as a leakage current, where the first resistor is located on a positive direct current bus, the second resistor is located on a negative direct current bus, and the first resistor and the second resistor are located on a trunk circuit in a system including the positive direct current bus, the negative direct current bus, and a load, or are located on a same branch circuit in the system.

With reference to the fourth aspect, in a first possible implementation manner, the determining module is further configured to determine an insulation fault occurs in a circuit including the load and located between the first resistor and the second resistor in the system when the leakage current is not equal to 0, and determine insulation of the system is normal when the leakage current is equal to 0.

With reference to the fourth aspect, in a second possible implementation manner, the detection module is further configured to detect a current flowing through a third resistor, and detect a current flowing through a fourth resistor, where the third resistor is located on the positive direct current bus, and the fourth resistor is located on the negative direct current bus. when the first resistor and the second resistor are located on the trunk circuit in the system, and the third resistor and the fourth resistor are located on a same branch circuit in the system, the determining module is further configured to determine an insulation fault occurs in a circuit that includes the load and that is located between the third resistor and the fourth resistor, and a leakage current which is a difference between the current flowing through the third resistor and the current flowing through the fourth resistor when the current flowing through the third resistor is not equal to the current flowing through the fourth resistor, and determine, when the current flowing through the third resistor is equal to the current flowing through the fourth resistor, and the current flowing through the first resistor is not equal to the current flowing through the second resistor, an insulation fault occurs in a positive direct current bus between the first resistor and the third resistor, or an insulation fault occurs in a negative direct current bus between the second resistor and the fourth resistor, or an insulation fault occurs in a circuit other than the circuit located between the third resistor and the fourth resistor, in a circuit including the load located between the first resistor and the second resistor in the system, and a leakage current which is the difference between the current flowing through the first resistor and the current flowing through the second resistor. Alternatively, when the first resistor and the second resistor are located on a same branch circuit in the system, and the third resistor and the fourth resistor are located on the trunk circuit in the system, the determining module is further configured to determine an insulation fault occurs in a circuit that includes the load located between the first resistor and the second resistor, and a leakage current which is the difference between the current flowing through the first resistor and the current flowing through the second resistor when the current flowing through the first resistor is not equal to the current flowing through the second resistor, and determine, when the current flowing through the first resistor is equal to the current flowing through the second resistor, and the current flowing through the third resistor is not equal to the current flowing through the fourth resistor, an insulation fault occurs in a positive direct current bus between the first resistor and the third resistor, or an insulation fault occurs in a negative direct current bus between the second resistor and the fourth resistor, or an insulation fault occurs in a circuit other than the circuit located between the first resistor and the second resistor, in a circuit including the load located between the third resistor and the fourth resistor in the system, and a leakage current which is a difference between the current flowing through the third resistor and the current flowing through the fourth resistor.

With reference to the second possible implementation manner of the fourth aspect, in a third possible implementation manner, the determining module is further configured to determine that insulation of the system is normal when the current flowing through the first resistor is equal to the current flowing through the second resistor, and the current flowing through the third resistor is equal to the current flowing through the fourth resistor.

Beneficial effects of the embodiments of the present application are included below. According to the leakage current detection circuit, the high voltage direct current system, the leakage current detection method and apparatus that are provided in the embodiments of the present application, a current flowing through a first resistor located on a positive direct current bus can be detected, a current through a second resistor located on a negative direct current bus can be detected, and a difference between the current flowing through the first resistor and the current flowing through the second resistor is determined and is used as a leakage current, where the first resistor and the second resistor may be located on a trunk circuit in a system including the positive direct current bus, the negative direct current bus, and a load, or may be located on a same branch circuit in a system. Therefore, by means of the leakage current detection circuit, the high voltage direct current system, and the leakage current detection method and apparatus that are provided in the embodiments of the present application, problems such as when a sensor for detecting a magnetic field is used to detect a leakage current, sensitivity of leakage current detection is relatively low because the sensor for detecting a magnetic field has relatively low sensitivity, and when the sensor for detecting a magnetic field is used to detect a leakage current, system reliability is reduced because the sensor is easily interfered by an environmental magnetic field can be avoided.

DESCRIPTION OF EMBODIMENTS

According to a leakage current detection circuit, a high voltage direct current system, and a leakage current detection method and apparatus that are provided in embodiments of the present application, a current flowing through a first resistor located on a positive direct current bus can be detected, a current through a second resistor located on a negative direct current bus can be detected, and a difference between the current flowing through the first resistor and the current flowing through the second resistor is determined and is used as a leakage current, where the first resistor and the second resistor may be located on a trunk circuit in a system including the positive direct current bus, the negative direct current bus, and a load, or may be located on a same branch circuit in a system. As a result, detecting a leakage current using of a sensor for detecting a magnetic field is avoided. Therefore, disadvantages caused using the sensor are also avoided.

Implementation manners of the leakage current detection circuit, the high voltage direct current system, and the leakage current detection method and apparatus that are provided in the embodiments of the present application are described below with reference to the accompanying drawings of the specification.

Figure 1:
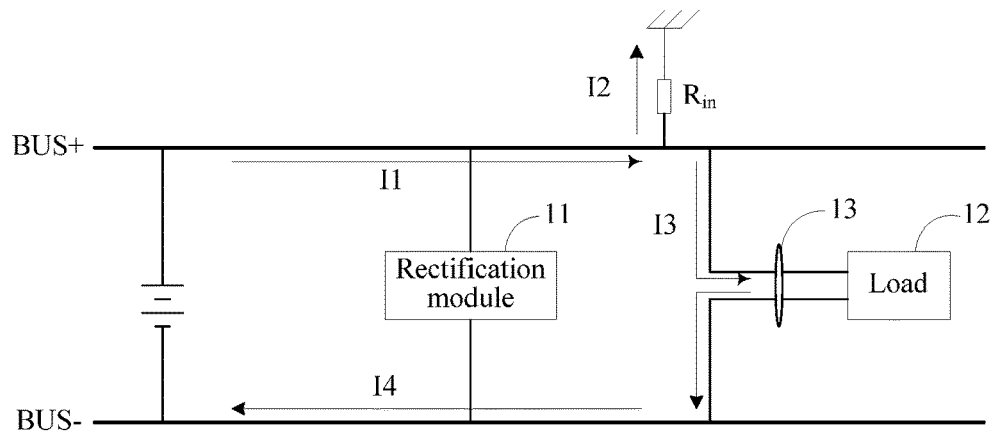
FIG. 1 is a schematic structural diagram of a leakage current detection circuit.
Figure 2A:
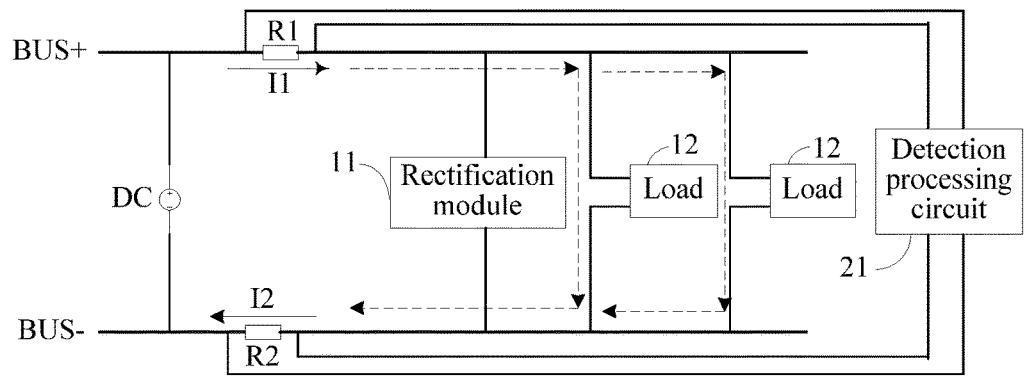
FIG. 2A is a schematic structural diagram 1 of a leakage current detection circuit and a high voltage direct current system according to an embodiment of the present application.
Figure 2B:
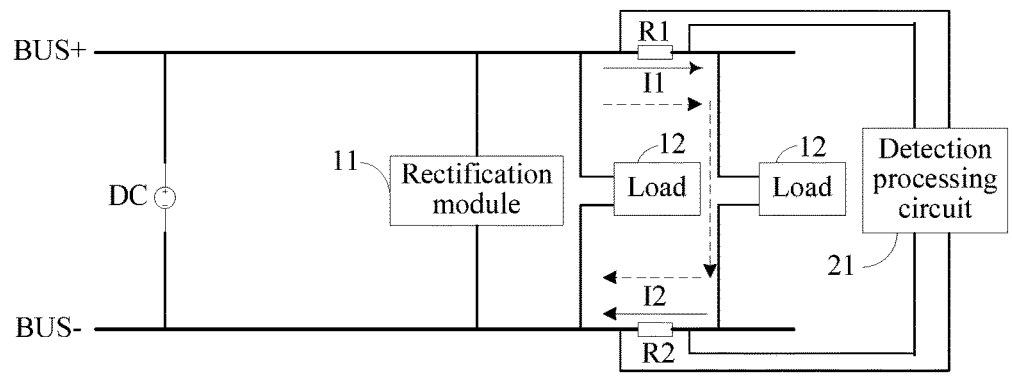
FIG. 2B is a schematic structural diagram 2 of a leakage current detection circuit and a high voltage direct current system according to an embodiment of the present application.

As shown in FIG. 2A or FIG. 2B, a leakage current detection circuit provided in an embodiment of the present application includes a first resistor R1 located on a positive direct current bus BUS+, a second resistor R2 located on a negative direct current bus BUS−, and a detection processing circuit 21 separately connected to the first resistor R1 and the second resistor R2. In FIG. 2A, the first resistor R1 and the second resistor R2 are located on a trunk circuit in a system including the positive direct current bus BUS+, the negative direct current bus BUS−, and loads 12. In FIG. 2B, the first resistor R1 and the second resistor R2 are located on a same branch circuit in the system. In FIG. 2A and FIG. 2B, the system further includes a direct current power DC. In FIG. 2A and FIG. 2B, descriptions are both provided using an example in which two loads 12 are connected in parallel, and in practice, there may be multiple loads connected in parallel.

The detection processing circuit 21 is configured to detect a current I1 flowing through the first resistor R1, detect a current I2 flowing through the second resistor R2, and determine a difference between the current I1 flowing through the first resistor R1 and the current I2 flowing through the second resistor R2, that is, I1-I2, as a leakage current.

When detecting a current flowing through a resistor, the detection processing circuit 21 may first detect a voltage between two ends of the resistor, and then calculate the current flowing through the resistor using the Ohm's law according to the voltage between the two ends of the resistor and a resistance of the resistor.

Optionally, the detection processing circuit 21 is further configured to determine that an insulation fault occurs in a circuit (e.g., circuits along dashed lines in FIG. 2A or a circuit along a dashed line in FIG. 2B) including the load(s) 12 and located between the first resistor R1 and the second resistor R2 in the system when the determined leakage current, that is, I1-I2, is not equal to 0. Determine that insulation of the system is normal when the leakage current, that is, I1-I2, is equal to 0.

Figure 3A:
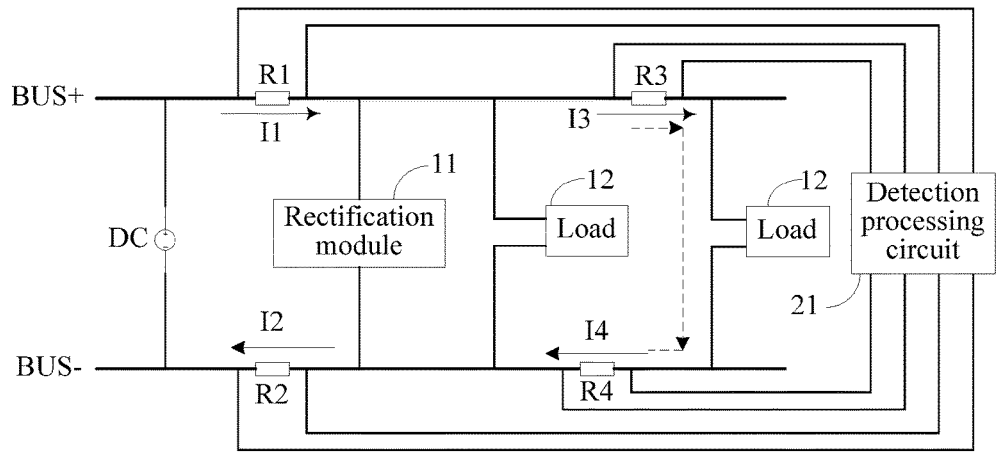
FIG. 3A is a schematic structural diagram 3 of a leakage current detection circuit and a high voltage direct current system according to an embodiment of the present application.
Figure 3B:
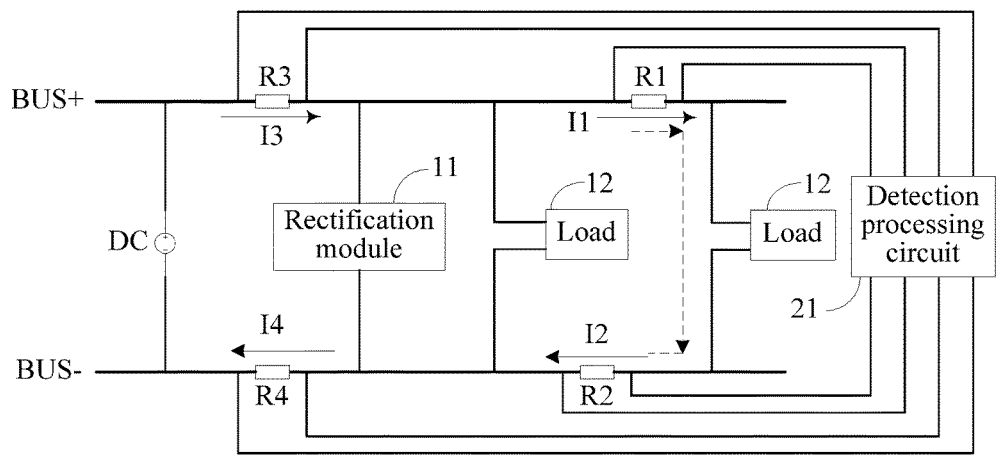
FIG. 3B is a schematic structural diagram 4 of a leakage current detection circuit and a high voltage direct current system according to an embodiment of the present application.

Optionally, as shown in FIG. 3A or FIG. 3B, the leakage current detection circuit provided in this embodiment of the present application further includes a third resistor R3 located on the positive direct current bus BUS+ and a fourth resistor R4 located on the negative direct current bus BUS−, where the detection processing circuit 21 is separately connected to the third resistor R3 and the fourth resistor R4.

The detection processing circuit 21 is further configured to detect a current flowing through a third resistor R3, and detect a current flowing through a fourth resistor R4.

As shown in FIG. 3A, the first resistor R1 and the second resistor R2 are located on the trunk circuit in the system including the positive direct current bus BUS+, the negative direct current bus BUS−, and the loads 12, and the third resistor R3 and the fourth resistor R4 are located on a same branch circuit in the system.

In FIG. 3A, the detection processing circuit 21 is further configured to determine, when the current I3 flowing through the third resistor R3 is not equal to the current I4 flowing through the fourth resistor R4, an insulation fault occurs in a circuit (e.g., a circuit along a dashed line in FIG. 3A) that includes the load 12 located between the third resistor R3 and the fourth resistor R4, and a leakage current which is a difference between the current I3 flowing through the third resistor R3 and the current I4 flowing through the fourth resistor R4, such as I3-I4. When the current I3 flowing through the third resistor R3 is equal to the current I4 flowing through the fourth resistor R4, and the current I1 flowing through the first resistor R1 is not equal to the current I2 flowing through the second resistor R2, determine an insulation fault occurs in a positive direct current bus BUS+ between the first resistor R1 and the third resistor R3, or an insulation fault occurs in a negative direct current bus BUS− between the second resistor R2 and the fourth resistor R4, or an insulation fault occurs in a circuit (e.g., a branch circuit on which a left load 12 of the two loads 12 in FIG. 3A is located) other than the circuit located between the third resistor R3 and the fourth resistor R4, in a circuit including the load 12 located between the first resistor R1 and the second resistor R2 in the system, and the leakage current which is the difference between the current I1 flowing through the first resistor R1 and the current I2 flowing through the second resistor R2, that is, I1-I2.

As shown in FIG. 3B, the first resistor R1 and the second resistor R2 are located on a same branch circuit in the system including the positive direct current bus BUS+, the negative direct current bus BUS−, and the loads 12. The third resistor R3 and the fourth resistor R4 are located on the trunk circuit in the system.

In FIG. 3B, the detection processing circuit 21 is further configured to determine, when the current I1 flowing through the first resistor R1 is not equal to the current I2 flowing through the second resistor R2, an insulation fault occurs in a circuit (e.g., a circuit along a dashed line in FIG. 3B) that includes the load 12 located between the first resistor R1 and the second resistor R2, and the leakage current which is the difference between the current I1 flowing through the first resistor R1 and the current I2 flowing through the second resistor R2. When the current I1 flowing through the first resistor R1 is equal to the current I2 flowing through the second resistor R2, and the current I3 flowing through the third resistor R3 is not equal to the current I4 flowing through the fourth resistor R4, determine an insulation fault occurs in a positive direct current bus BUS+ between the first resistor R1 and the third resistor R3, or an insulation fault occurs in a negative direct current bus BUS− between the second resistor R2 and the fourth resistor R4, or an insulation fault occurs in a circuit (e.g., a branch circuit on which a left load 12 of the two loads 12 in FIG. 3B is located) other than the circuit located between the first resistor R1 and the second resistor R2, in a circuit including the loads 12 located between the third resistor R3 and the fourth resistor R4 in the system, and the leakage current which is a difference between the current I3 flowing through the third resistor R3 and the current I4 flowing through the fourth resistor R4, such as I3-I4.

Optionally, the detection processing circuit 21 is further configured to determine that insulation of the system including the positive direct current bus BUS+, the negative direct current bus BUS−, the direct current power DC, and the load 12 is normal when the current I1 flowing through the first resistor R1 is equal to the current I2 flowing through the second resistor R2, and the current I3 flowing through the third resistor R3 is equal to the current I4 flowing through the fourth resistor R4.

In an actual application, there is a relatively long distance between a rectification module and a load. Therefore, after the third resistor and the fourth resistor are added, a fault point range of can be narrowed and a maintenance range can be quickly located.

In addition, in an actual application, the system may include n loads connected in parallel. N is greater than or equal to 2. In an embodiment, when the first resistor and the second resistor are located on the trunk circuit in the system, there are n−1 third resistors on the positive direct current bus in the system, and n−1 fourth resistors on the negative direct current bus in the system, every two third resistors are located on two sides of at least one load, and every two fourth resistors are located on two sides of at least one load. A fault point range of can be quickly narrowed and a maintenance range can be quickly positioned according to the foregoing description.

As shown in FIG. 2A, FIG. 2B, FIG. 3A, or FIG. 3B, a high voltage direct current system provided in an embodiment of the present application includes a direct current power DC, a positive direct current bus BUS+, a negative direct current bus BUS−, a rectification module 11, a load 12, and the leakage current detection circuit provided in the embodiment of the present application.

Figure 4:
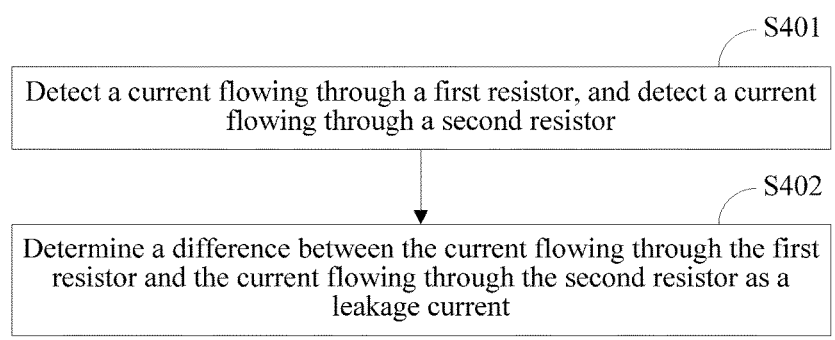
FIG. 4 is a flowchart 1 of a leakage current detection method according to an embodiment of the present application.

As shown in FIG. 4, a leakage current detection method provided in an embodiment of the present application is applied to a circuit shown in FIG. 2A or FIG. 2B, and the method include the following steps.

Step S401: Detect a current flowing through a first resistor, and detect a current flowing through a second resistor.

Step S402: Determine a difference between the current flowing through the first resistor and the current flowing through the second resistor as a leakage current.

The first resistor is located on a positive direct current bus, the second resistor is located on a negative direct current bus, and the first resistor and the second resistor are located on a trunk circuit in a system including the positive direct current bus, the negative direct current bus, and a load, or are located on a same branch circuit in the system.

Figure 5:
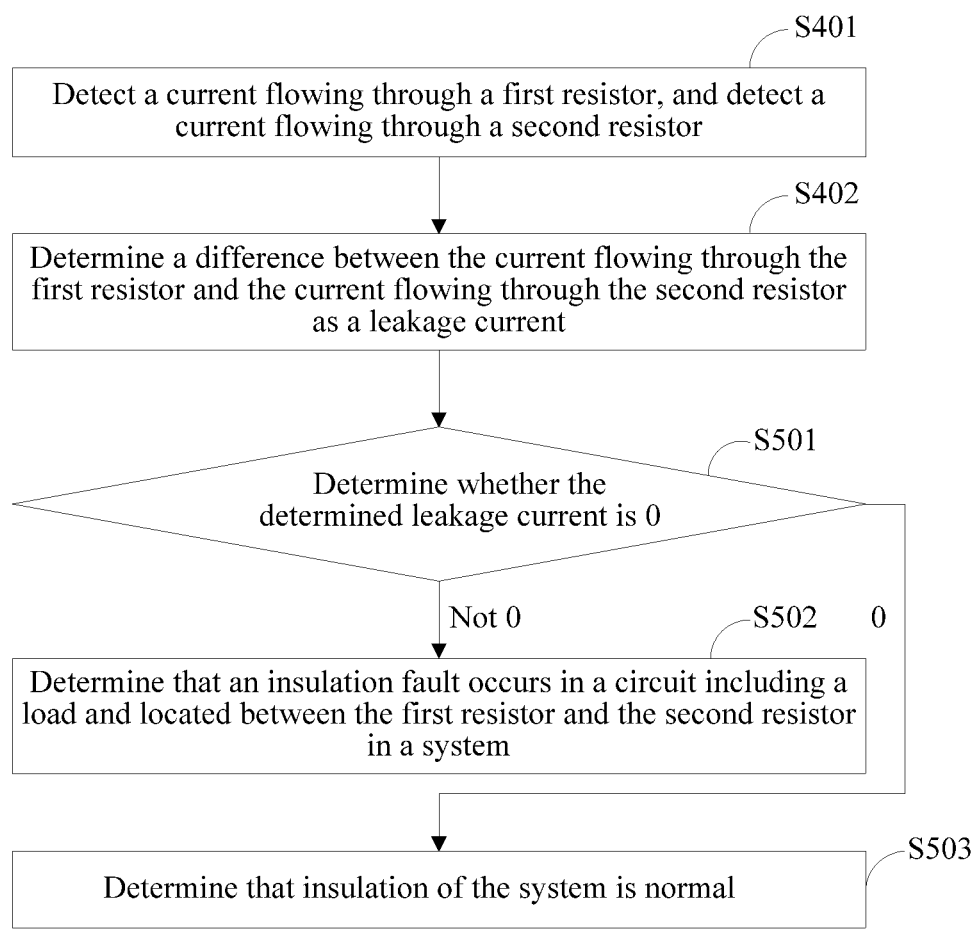
FIG. 5 is a flowchart 2 of a leakage current detection method according to an embodiment of the present application.

Optionally, as shown in FIG. 5, the leakage current detection method provided in this embodiment of the present application further includes the following steps.

Step S501: Determine whether the determined leakage current is 0; perform S502 when the determined leakage current is not 0; and perform S503 when the determined leakage current is 0.

Step S502: Determine an insulation fault occurs in a circuit including the load and located between the first resistor R1 and the second resistor R2 in a system.

Step S503: Determine that insulation of the system is normal.

Figure 6A:
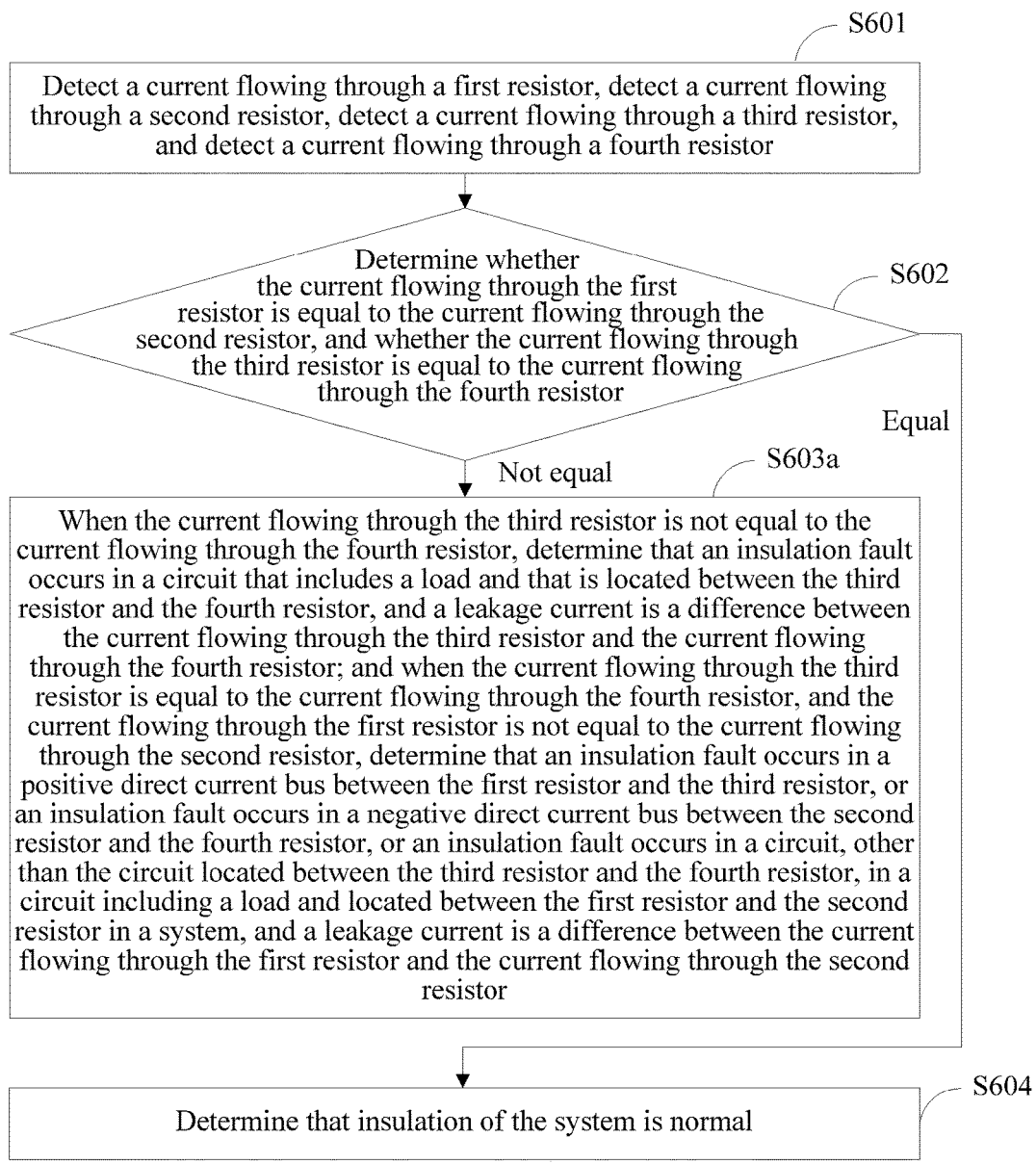
FIG. 6A is a flowchart 3 of a leakage current detection method according to an embodiment of the present application.

Optionally, as shown in FIG. 6A, the leakage current detection method provided in this embodiment of the present application is applied to the leakage current detection circuit shown in FIG. 3A, for example, the first resistor and the third resistor are both located on a positive direct current bus, the second resistor and the fourth resistor are both located on a negative direct current bus, the first resistor and the second resistor are located on a trunk circuit in the system, and the third resistor and the fourth resistor are located on a same branch circuit in the system. The method includes the following steps.

Step S601: Detect a current flowing through a first resistor, detect a current flowing through a second resistor, detect a current flowing through a third resistor, and detect a current flowing through a fourth resistor.

Step S602: Determine whether the current flowing through the first resistor is equal to the current flowing through the second resistor, and whether the current flowing through the third resistor is equal to the current flowing through the fourth resistor, perform S603a if the current flowing through the third resistor is not equal to the current flowing through the fourth resistor, or the current flowing through the first resistor is not equal to the current flowing through the second resistor; and perform S604 if the current flowing through the first resistor is equal to the current flowing through the second resistor, and the current flowing through the third resistor is equal to the current flowing through the fourth resistor.

Step S603a: determine, when the current flowing through the third resistor is not equal to the current flowing through the fourth resistor, an insulation fault occurs in a circuit that includes a load located between the third resistor and the fourth resistor, and a leakage current which is a difference between the current flowing through the third resistor and the current flowing through the fourth resistor. When the current flowing through the third resistor is equal to the current flowing through the fourth resistor, and the current flowing through the first resistor is not equal to the current flowing through the second resistor, determine an insulation fault occurs in a positive direct current bus between the first resistor and the third resistor, or an insulation fault occurs in a negative direct current bus between the second resistor and the fourth resistor, or an insulation fault occurs in a circuit other than the circuit located between the third resistor and the fourth resistor, in a circuit including a load located between the first resistor and the second resistor in the system, and a leakage current which is a difference between the current flowing through the first resistor and the current flowing through the second resistor.

Step S604: Determine that insulation of the system including the positive direct current bus, the negative direct current bus, a direct current power, and the load is normal.

Figure 6B:
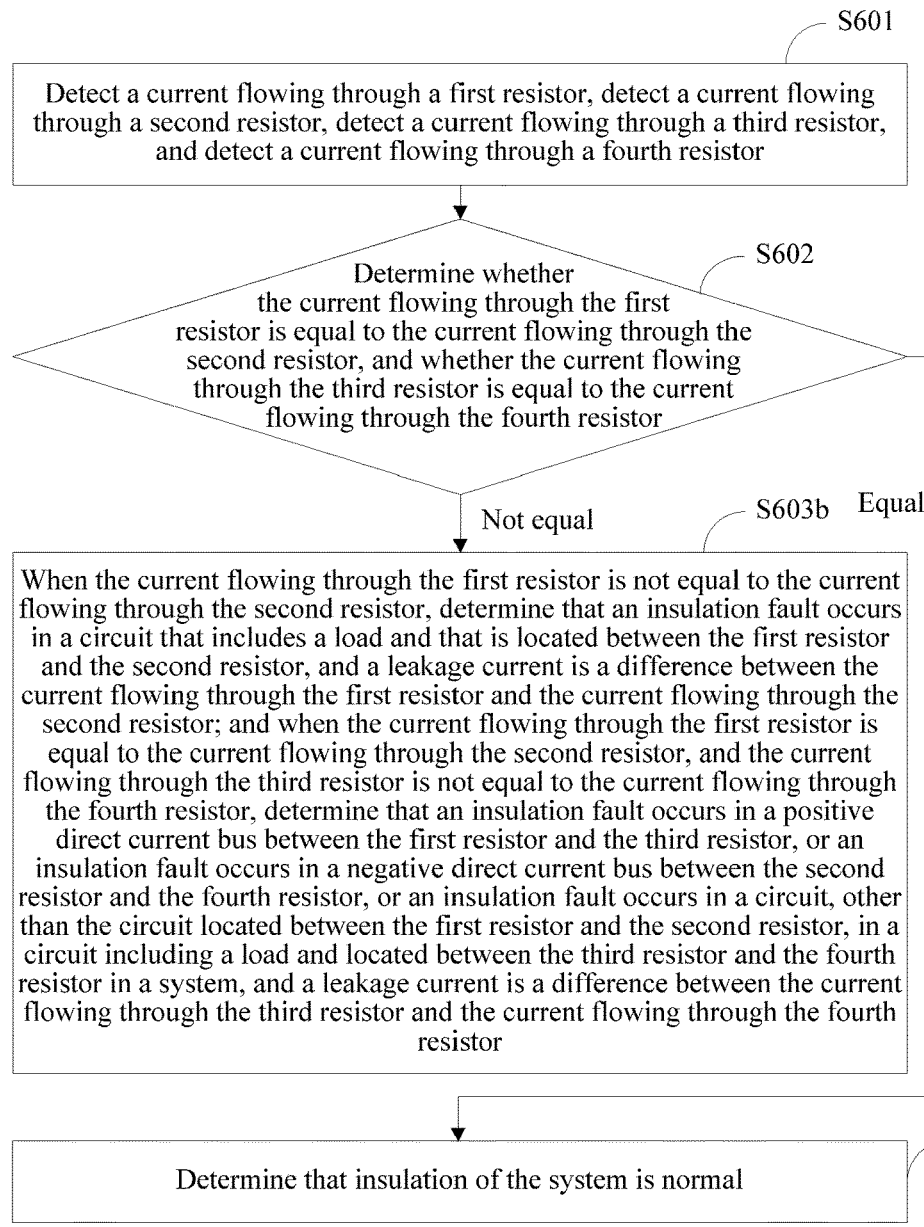
FIG. 6B is a flowchart 4 of a leakage current detection method according to an embodiment of the present application.

Optionally, as shown in FIG. 6B, the leakage current detection method provided in this embodiment of the present application is applied to the leakage current detection circuit shown in FIG. 3B, for example, the first resistor and the third resistor are both located on a positive direct current bus, the second resistor and the fourth resistor are both located on a negative direct current bus, the first resistor and the second resistor are located on a trunk circuit in the system, and the third resistor and the fourth resistor are located on a same branch circuit in the system. The method includes the following steps.

Step S601: Detect a current flowing through a first resistor, detect a current flowing through a second resistor, detect a current flowing through a third resistor, and detect a current flowing through a fourth resistor.

Step S602: Determine whether the current flowing through the first resistor is equal to the current flowing through the second resistor, and whether the current flowing through the third resistor is equal to the current flowing through the fourth resistor; perform S603b if not equal, and perform S604 if equal.

Step S603b: When the current flowing through the first resistor is not equal to the current flowing through the second resistor, determine an insulation fault occurs in a circuit that includes the load located between the first resistor and the second resistor, and a leakage current which is a difference between the current flowing through the first resistor and the current flowing through the second resistor. When the current flowing through the first resistor is equal to the current flowing through the second resistor, and the current flowing through the third resistor is not equal to the current flowing through the fourth resistor, determine an insulation fault occurs in a positive direct current bus between the first resistor and the third resistor, or an insulation fault occurs in a negative direct current bus between the second resistor and the fourth resistor, or an insulation fault occurs in a circuit other than the circuit located between the first resistor and the second resistor, in a circuit including the load located between the third resistor and the fourth resistor in the system, and a leakage current which is a difference between the current flowing through the third resistor and the current flowing through the fourth resistor.

Step S604: Determine that insulation of the system including the positive direct current bus, the negative direct current bus, the direct current power, and the load is normal.

When a current flowing through a resistor is detected in the foregoing, a voltage between two ends of the resistor may be detected first, and the current flowing through the resistor is then calculated using the Ohm's law according to the voltage between the two ends of the resistor and a resistance of the resistor.

Based on a same inventive concept, an embodiment of the present application further provides a leakage current detection apparatus. Because the principle for resolving a problem by the apparatus is similar to the foregoing leakage current detection method For implementation of the apparatus, refer to the foregoing method. Repeated content is not described again.

Figure 7:
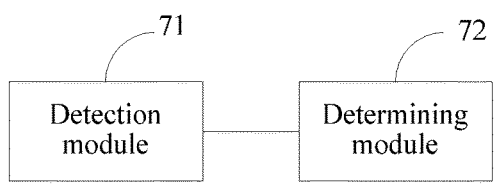
FIG. 7 is a structural diagram of a leakage current detection apparatus according to an embodiment of the present application.

As shown in FIG. 7, a leakage current detection apparatus provided in an embodiment of the present application includes a detection module 71 configured to detect a current flowing through a first resistor, and detect a current flowing through a second resistor, and a determining module 72 configured to determine a difference between the current flowing through the first resistor and the current flowing through the second resistor as a leakage current, where the first resistor is located on a positive direct current bus, the second resistor is located on a negative direct current bus, and the first resistor and the second resistor are located on a trunk circuit in a system including the positive direct current bus, the negative direct current bus, and a load, or are located on a same branch circuit in the system.

Optionally, the determining module 72 is further configured to determine an insulation fault occurs in a circuit including the load located between the first resistor and the second resistor in the system when the leakage current is not equal to 0, and determine that insulation of the system is normal when the leakage current is equal to 0.

Optionally, the detection module 71 is further configured to detect a current flowing through a third resistor, and detect a current flowing through a fourth resistor, where the third resistor is located on the positive direct current bus, and the fourth resistor is located on the negative direct current bus. When the first resistor and the second resistor are located on the trunk circuit in the system, and the third resistor and the fourth resistor are located on a same branch circuit in the system, the determining module 72 is further configured to determine an insulation fault occurs in a circuit that includes the load located between the third resistor and the fourth resistor, and a leakage current which is a difference between the current flowing through the third resistor and the current flowing through the fourth resistor when the current flowing through the third resistor is not equal to the current flowing through the fourth resistor, and determine, when the current flowing through the third resistor is equal to the current flowing through the fourth resistor, and the current flowing through the first resistor is not equal to the current flowing through the second resistor, an insulation fault occurs in a positive direct current bus between the first resistor and the third resistor, or an insulation fault occurs in a negative direct current bus between the second resistor and the fourth resistor, or an insulation fault occurs in a circuit other than the circuit located between the third resistor and the fourth resistor, in a circuit including the load located between the first resistor and the second resistor in the system, and a leakage current which is the difference between the current flowing through the first resistor and the current flowing through the second resistor. Alternatively, when the first resistor and the second resistor are located on a same branch circuit in the system, and the third resistor and the fourth resistor are located on the trunk circuit in the system, the determining module 72 is further configured to determine, when the current flowing through the first resistor is not equal to the current flowing through the second resistor, an insulation fault occurs in a circuit that includes the load located between the first resistor and the second resistor, and a leakage current which is the difference between the current flowing through the first resistor and the current flowing through the second resistor, and determine, when the current flowing through the first resistor is equal to the current flowing through the second resistor, and the current flowing through the third resistor is not equal to the current flowing through the fourth resistor, an insulation fault occurs in a positive direct current bus between the first resistor and the third resistor, or an insulation fault occurs in a negative direct current bus between the second resistor and the fourth resistor, or an insulation fault occurs in a circuit other than the circuit located between the first resistor and the second resistor, in a circuit including the load located between the third resistor and the fourth resistor in the system, and a leakage current which is a difference between the current flowing through the third resistor and the current flowing through the fourth resistor.

Optionally, the determining module 72 is further configured to determine that insulation of the system including the positive direct current bus, the negative direct current bus, the direct current power, and the load is normal when the current flowing through the first resistor is equal to the current flowing through the second resistor, and the current flowing through the third resistor is equal to the current flowing through the fourth resistor.

A person skilled in the art should understand that the embodiments of the present application may be provided as a method, a system, or a computer program product. Therefore, the present application may use a form of hardware only embodiments, software only embodiments, or embodiments with a combination of software and hardware. Moreover, the present application may use a form of a computer program product that is implemented on one or more computer-usable storage media (e.g., a disk memory, a compact disk read only memory (CD-ROM), an optical memory, and the like) that include computer-usable program code.

The present application is described with reference to the flowcharts and/or block diagrams of the method, the device (system), and the computer program product according to the embodiments of the present application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine such that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device such that a series of operations and steps are performed on the computer or the other programmable device, thereby generating computer-implemented processing. Therefore, the instructions executed on the computer or the other programmable device provide steps for implementing a specific function in one or more processes in the flowcharts and/or in one or more blocks in the block diagrams.

Although some preferred embodiments of the present application have been described, persons skilled in the art can make changes and modifications to these embodiments once they learn the basic inventive concept. Therefore, the following claims are intended to be construed as to cover the preferred embodiments and all changes and modifications falling within the scope of the present application.

Obviously, persons skilled in the art can make various modifications and variations to the embodiments of the present application without departing from the spirit and scope of the embodiments of the present application. The present application is intended to cover these modifications and variations provided that they fall within the scope of protection defined by the following claims and their equivalent technologies.

What is claimed is:

1. A leakage current detection circuit, comprising:
a first resistor coupled to a positive direct current (DC) bus;
a second resistor coupled to a negative DC bus;
a third resistor coupled in series to the first resistor and to the positive DC bus;
a fourth resistor coupled in series to the second resistor and to the negative DC bus; and
a detection processing circuit separately connected to the first resistor and the second resistor, the first resistor and the second resistor either:
  coupled to a trunk circuit in a system comprising the positive DC bus, the negative DC bus and a first load coupled to and located between the first resistor and the second resistor; or
  coupled to and located on a same branch circuit in the system, the detection processing circuit being configured to:
    detect a first current flowing through the first resistor;
    detect a second current flowing through the second resistor;
    detect a third current flowing through the third resistor;
    detect a fourth current flowing through the fourth resistor;
    determine a difference between the first current and the second current as a first leakage current;
    determine an insulation fault occurs in a circuit comprising the first load when the first current is equal to the second current and the third current is equal to the fourth current; and
    determine that insulation of the system is normal when the first leakage current is equal to zero.

2. The leakage current detection circuit of claim 1, wherein the detection processing circuit is further configured to determine an insulation fault occurs in a circuit comprising the first load, and the first leakage current not being equal to zero.

3. The leakage current detection circuit of claim 1, wherein the third resistor is coupled to the positive DC bus, the fourth resistor being coupled to the negative DC bus, the detection processing circuit being separately connected to the third resistor and the fourth resistor, the third resistor and the fourth resistor being located on the same branch circuit in the system, and the detection processing circuit being further configured to:
  determine, when the third current is not equal to the fourth current, an insulation fault occurs in the circuit comprising a second load coupled to and located between the third resistor and the fourth resistor, a second leakage current being a difference between the third current and the fourth current; and determine, when the third current is equal to the fourth current and the first current is not equal to the second current, at least one of:
an insulation fault occurs in a positive DC bus between the first resistor and the third resistor;
an insulation fault occurs in a negative DC bus between the second resistor and the fourth resistor; or
an insulation fault occurs in a circuit other than the circuit coupled to and located between the third resistor and the fourth resistor, in a circuit comprising the first load in the system, and the first leakage current being the difference between the first current and the second current.

4. The leakage current detection circuit of claim 1, wherein the third resistor is coupled to the positive DC bus, the fourth resistor being coupled to the negative DC bus, the detection processing circuit being separately connected to the third resistor and the fourth resistor, the first resistor and the second resistor being coupled to a same branch circuit in the system, the third resistor and the fourth resistor being coupled to the trunk circuit in the system, and the detection processing circuit being further configured to:
determine, when the first current not being equal to the second current, an insulation fault occurs in a circuit that comprises the first load, and the first leakage current being the difference between the first current and the second current; and
determine, when the first current flowing being equal to the second current and the third current not being equal to the fourth current, at least one of:
an insulation fault occurs in the positive DC bus between the first resistor and the third resistor;
an insulation fault occurs in the negative DC bus between the second resistor and the fourth resistor; or
an insulation fault occurs in a circuit other than the circuit located between the first resistor and the second resistor, in a circuit comprising a second load coupled to and located between the third resistor and the fourth resistor in the system, and a second leakage current being a difference between the third current and the fourth current.

5. The leakage current detection circuit of claim 3, wherein the detection processing circuit is further configured to determine that insulation of the system is normal, the first current being equal to the second current and the third current is equal to the fourth current.

6. A high voltage direct current (DC) system, comprising:
a DC power;
a positive DC bus;
a negative DC bus;
a rectification module coupled to the positive DC bus and the negative DC bus;
a first load; and
a leakage current detection circuit coupled to the positive DC bus and the negative DC bus, the leakage current detection circuit comprising:
a first resistor coupled to the positive DC bus;
a second resistor coupled to the negative DC bus; and
a detection processing circuit separately connected to the first resistor and the second resistor, the first resistor and the second resistor either:
coupled to and located on a trunk circuit in a system comprising the positive DC bus, the negative DC bus and the first load; or
coupled to and located on a same branch circuit in the system, the detection processing circuit being configured to:
detect a first current flowing through the first resistor;
detect a second current flowing through the second resistor; and
determine a difference between the first current and the second current as a first leakage current;
detect a third current flowing through a third resistor;
detect a fourth current flowing through a fourth resistor;
determine an insulation fault occurs in a circuit comprising the first load located between the first resistor and the second resistor in the system when the first current is equal to the second current and the third current is equal to the fourth current flowing through the fourth resistor; and
determine that insulation of the system is normal when the first leakage current is equal to zero.

7. The high voltage DC system to of claim 6, wherein the third resistor is coupled to the positive DC bus, the fourth resistor being coupled to the negative DC bus, the detection processing circuit being separately connected to the third resistor and the fourth resistor, the detection processing circuit being further configured to detect the third current and detect the fourth current flowing through a fourth resistor, the first resistor and the second resistor being located on a same branch circuit in the system and the third resistor and the fourth resistor are located on the trunk circuit in the system, the detection processing circuit being further configured to:
determine, when the first current is not equal to the second current, an insulation fault occurs in a circuit that comprises the first load; and
determine, when the first current is equal to the second current and the third current is not equal to the fourth current flowing through the fourth resistor, at least one of:
an insulation fault occurs in a positive DC bus between the first resistor and the third resistor;
an insulation fault occurs in a negative DC bus between the second resistor and the fourth resistor; or
an insulation fault occurs in a circuit other than the circuit located between the first resistor and the second resistor, in a circuit comprising a second load located between the third resistor and the fourth resistor in the system, and a second leakage current being a difference between the the third current and the fourth current.

8. The high voltage DC system of claim 6, further comprising:
a third resistor coupled to the positive DC bus; and
a fourth resistor coupled to the negative DC bus, the detection processing circuit being separately connected to the third resistor and the fourth resistor, the detection processing circuit being further configured to:
detect the third current; and
detect the fourth current, the first resistor and the second resistor being located on the trunk circuit in the system, the third resistor and the fourth resistor being located on a same branch circuit in the system, the detection processing circuit being further configured to:

determine, when the third current is not equal to the fourth current, an insulation fault occurs in a circuit that comprises a second load located between the third resistor and the fourth resistor, a second leakage current being a difference between the the third current and the fourth current; and determine, when the third current is equal to the fourth current and the first current is not equal to the second current, at least one of:

an insulation fault occurs in the positive DC bus between the first resistor and the third resistor;

an insulation fault occurs in the negative DC bus between the second resistor and the fourth resistor; or an insulation fault occurs in a circuit other than the circuit located between the third resistor and the fourth resistor, in a circuit comprising the first load located between the first resistor and the second resistor in the system, and the first leakage current being the difference between the the first current and the second current.

9. The high voltage DC system of claim 7, wherein the detection processing circuit is further configured to determine that insulation of the system is normal, the first current being equal to the second current and the third current being equal to the fourth current.

10. A leakage current detection method, comprising:
detecting a first current flowing through a first resistor;
detecting a second current flowing through a second resistor; and
determining a difference between the first current and the second current as a first leakage current, the first resistor being coupled to a positive DC bus, the second resistor being coupled to a negative DC bus, and the first resistor and the second resistor either:
coupled to a trunk circuit in a system comprising the positive DC bus, the negative DC bus and a first load coupled to and located between the first resistor and the second resistor; or
coupled to and located on a same branch circuit in the system;
detecting a third current flowing through a third resistor;
detecting a fourth current flowing through a fourth resistor;
determining an insulation fault occurs in a circuit comprising the first load in the system when the first current is equal to the second current and the third current is equal to the fourth current; and
determining that insulation of the system is normal when the first leakage current is equal to zero.

11. The method of claim 10, wherein the third resistor is coupled to the positive DC bus and the fourth resistor is coupled to the negative DC bus, the first resistor and the second resistor being coupled to a same branch circuit in the system and the third resistor and the fourth resistor being coupled to the trunk circuit in the system, the method further comprising:

determining, when the first current is not equal to the second current, an insulation fault occurs in a circuit that comprises the first load, the first leakage current being the difference between the first current and the second current; and determining, when the first current is equal to the second current and the third current is not equal to the fourth current, at least one of:

an insulation fault occurs in a positive DC bus between the first resistor and the third resistor;

an insulation fault occurs in a negative DC bus between the second resistor and the fourth resistor; or an insulation fault occurs in a circuit other than the circuit coupled to and located between the first resistor and the second resistor, in a circuit comprising a second load coupled to and located between the third resistor and the fourth resistor in the system, and a second leakage current being a difference between the third current and the fourth current.

12. The method of claim 10, further comprising determining that an insulation fault occurs in the circuit comprising the first load, and the first leakage current not being equal to zero.

13. The method of claim 10, wherein the third resistor is coupled to the positive DC bus and the fourth resistor is coupled to the negative DC bus, the first resistor and the second resistor being coupled to the trunk circuit in the system and the third resistor and the fourth resistor being coupled to a same branch circuit in the system, the method further comprising:

determining, when the third current is not equal to the fourth current, an insulation fault occurs in the circuit comprising a second load coupled to and located between the third resistor and the fourth resistor, a second leakage current being a difference between the third current and the fourth current; and determining, when the third current is equal to the fourth current and the first current is not equal to the second current, at least one of:

an insulation fault occurs in a positive DC bus between the first resistor and the third resistor;

an insulation fault occurs in a negative DC bus between the second resistor and the fourth resistor; or an insulation fault occurs in a circuit other than the circuit located between the third resistor and the fourth resistor in a circuit comprising the first load in the system, and the first leakage current being the difference between the first current and the second current.

* * * * *

UNITED STATES PATENT AND TRADEMARK OFFICE
CERTIFICATE OF CORRECTION

PATENT NO. : 10,168,376 B2
APPLICATION NO. : 15/339117
DATED : January 1, 2019
INVENTOR(S) : Jing Yang and Zongwang Zhang Page 1 of 1

It is certified that error appears in the above-identified patent and that said Letters Patent is hereby corrected as shown below:

On the Title Page

Item (30), Line 1: "201410178867" should read "201410178867.6"

In the Claims

Column 16, Line 23: "system to of" should read "system of"

Column 16, Line 51: "between the the third" should read "between the third"

Column 17, Line 6: "the the third" should read "the third"

Column 17, Line 21: "the the first" should read "the first"

Signed and Sealed this
Twenty-sixth Day of February, 2019

Andrei Iancu
*Director of the United States Patent and Trademark Office*